US012608639B2

(12) United States Patent
Patel et al.

(10) Patent No.: US 12,608,639 B2
(45) Date of Patent: Apr. 21, 2026

(54) SYSTEM AND METHOD FOR PREDICTIVE VOLUMETRIC AND STRUCTURAL EVALUATION OF STORAGE TANKS

(71) Applicant: Saudi Arabian Oil Company, Dhahran (SA)

(72) Inventors: Sahejad Patel, Thuwal (SA); Hassane Trigui, Thuwal (SA); Brian Parrott, Dhahran (SA); Fadl Abdellatif, Thuwal (SA)

(73) Assignee: Saudi Arabian Oil Company, Dhahran (SA)

( * ) Notice: Subject to any disclaimer, the term of this patent is extended or adjusted under 35 U.S.C. 154(b) by 1454 days.

(21) Appl. No.: 17/089,974

(22) Filed: Nov. 5, 2020

(65) Prior Publication Data

US 2022/0138622 A1 May 5, 2022

(51) Int. Cl.
*G06N 20/00* (2019.01)
*G06F 30/28* (2020.01)

(52) U.S. Cl.
CPC ............. *G06N 20/00* (2019.01); *G06F 30/28* (2020.01)

(58) Field of Classification Search
CPC ...... G01F 17/00; G01F 25/0084; G06F 30/28; G06N 20/00
See application file for complete search history.

(56) References Cited

U.S. PATENT DOCUMENTS

2020/0103548 A1* 4/2020 Yu ........................... G01F 22/00

FOREIGN PATENT DOCUMENTS

CN 111238598 A 6/2020

OTHER PUBLICATIONS

Gernaey et al, "Activated sludge wastewater treatment plant modelling and simulation: state of the art", 2004, Environmental Modelling & Software, vol. 19, Issue 9, pp. 763-783. (Year: 2004).*
Li et al, "Integrating Bayesian Calibration, Bias Correction, and Machine Learning for the 2014 Sandia Verification and Validation Challenge Problem", 2016, J. Verif. Valid. Uncert., vol. 1: 011004, pp. 1-12. (Year: 2016).*

(Continued)

*Primary Examiner* — Alexey Shmatov
*Assistant Examiner* — Clint Mullinax
(74) *Attorney, Agent, or Firm* — Leason Ellis LLP

(57) ABSTRACT

Systems and methods are provided for predictive volumetric and structural evaluation of petroleum product containers. The system includes a computing device in communication with data input devices and implementation tools including calibration devices for measuring tank volume among other physical parameters bearing on tank volume. The computing device receives sets of historical physical parameter data for a plurality of tanks and, using machine learning (ML), generates predictive ML models for estimating volumetric parameters of tanks. The predictive model is applied by the system to historical and current data values to estimate current volumetric parameters for a given tank and, based on the results, the system performs or coordinates further operations for the given tank using an implementation tool. The further operations can include inventory management, physical calibration, maintenance and inspection as well as system evaluation and control operations.

14 Claims, 3 Drawing Sheets

(56)            References Cited

OTHER PUBLICATIONS

Liu et al, "Design of high-performance water-in-glass evacuated tube solar water heaters by a high-throughput screening based on machine learning: A combined modeling and experimental study", 2017, Solar Energy, vol. 142, pp. 61-67. (Year: 2017).*

International Search Report and Written Opinion in corresponding PCT Application No. PCT/US2021/058174, mailed Feb. 11, 2022; 10 pages.

Sharifi, Mona, et al. "Prediction of Remaining Life in Pipes using Machine Learning from Thickness Measurements." SPE Western Regional Meeting. Society of Petroleum Engineers, 2015.

Li, Caihong, et al. "Mathematical model based on bp neural network algorithm for the deflection identification of storage tank and calibration of tank capacity chart." Abstract and Applied Analysis. vol. 2013. Hindawi, 2013.,' Li et al.

Sheng, Ooi Ching, et al. "Review of Underground Storage Tank Condition Monitoring Techniques." MATEC Web of Conferences. vol. 255. EDP Sciences, 2019.

Wang, Tong, et al. "Estimating the Volume of Oil Tanks Based on High-Resolution Remote Sensing Images." Remote Sensing 11.7 (2109): 793.

* cited by examiner

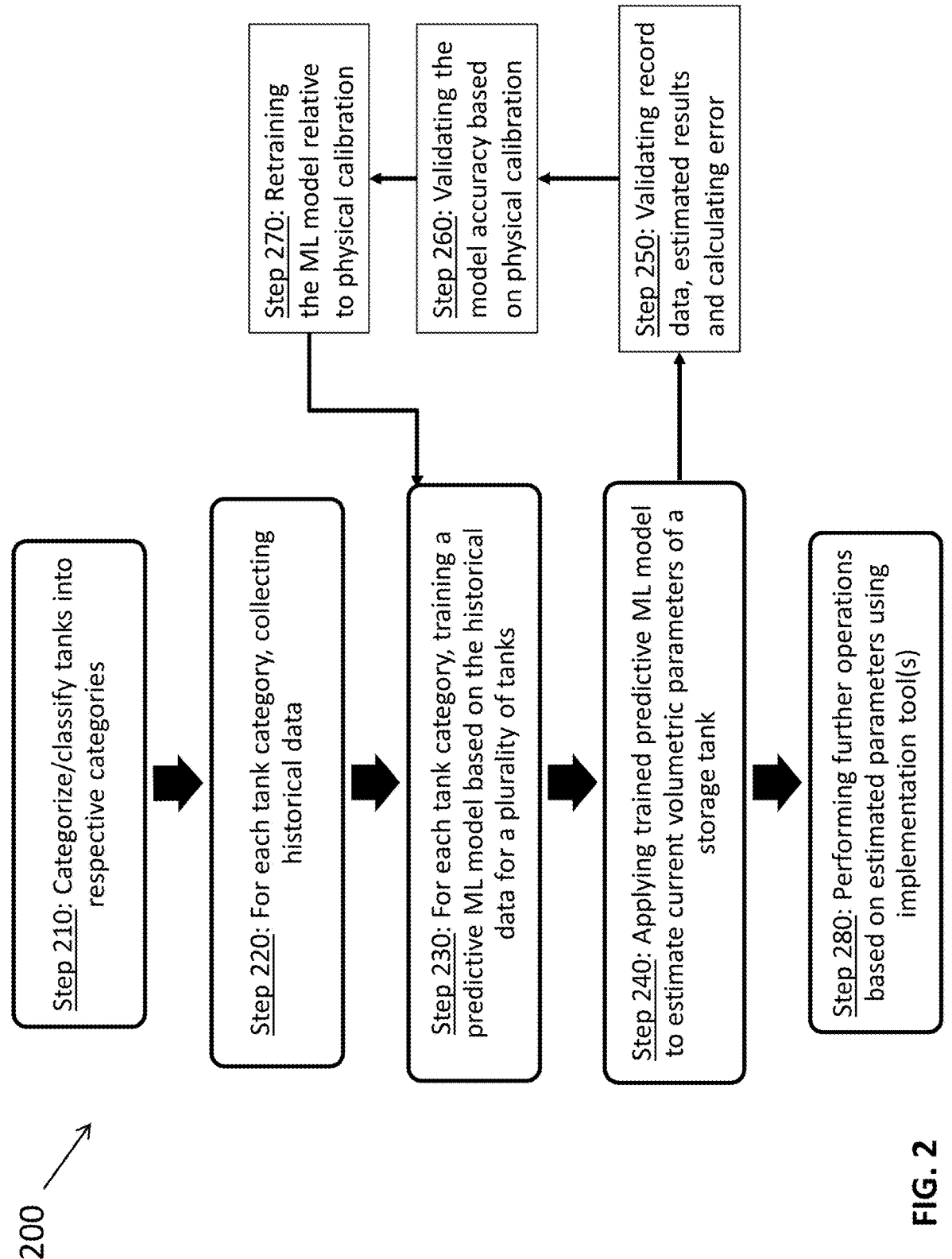

200

Step 210: Categorize/classify tanks into respective categories

Step 220: For each tank category, collecting historical data

Step 230: For each tank category, training a predictive ML model based on the historical data for a plurality of tanks Step 240: Applying trained predictive ML model to estimate current volumetric parameters of a storage tank Step 280: Performing further operations based on estimated parameters using implementation tool(s)

Step 270: Retraining the ML model relative to physical calibration

Step 260: Validating the model accuracy based on physical calibration

Step 250: Validating record data, estimated results and calculating error

FIG. 2

SYSTEM AND METHOD FOR PREDICTIVE VOLUMETRIC AND STRUCTURAL EVALUATION OF STORAGE TANKS

FIELD OF THE DISCLOSURE

The present disclosure relates to volume and structural evaluation of storage containers, and, more particularly, to systems and methods for predicting volumetric and structural characteristics of petroleum storage tanks and performing calibration and inspection activities.

BACKGROUND OF THE DISCLOSURE

In the oil and gas industry, the storage tanks for crude and refined products play a key part in the supply chain of hydrocarbons. Knowing the exact volume of these storage units plays a critical role when transferring products to and/or from the tanks. As a result of variations in external and internal conditions (e.g., temperature) and aging and also as a result of the weight of the liquid product (e.g., hydrostatic pressure), the tank volume can vary by as much as +/−0.2%. Considering a 250,000-barrel storage tank, this variation would result in a +/−500 barrel volume change.

In one illustrative example, custody transfer tanks are used to temporarily store liquid hydrocarbons prior to transferring them to the purchaser—in many cases, the calibrated volume of these tanks is one of the primary inputs used to quantify how much volume is being transferred. The exact volume of the tank is determined following the procedure as listed in API or ISO standards (API 2.2 A,B,C,D and other ISO 7507-1,2,3,4/5). The most commonly used techniques to perform tank volume calibration include manual strapping (API MPMS 2.2A), optical techniques (e.g., Optical Reference Line Method (ORLM)—API Chapter 2.2B, Optical Triangulation Method (OTM)—API Chapter 2.2C, Electro-Optical Distance Ranging Method (EODR)—API Chapter 2.2D), and liquid calibrations (API Standard 2555). The data collected by these procedures are used to generate the tank capacity table, which lists the volume contained in the tank along the full height of the tank (e.g., a relationship between height, usually in cm, and liquid volume at that height, in barrels). The operator uses the capacity table that was generated from the most recent calibration of the tanks to determine the transferred volume. The difference in the tank level between the beginning and ending of any quantity transfer represents the transferred volume. Then the seller charges the buyer for the volume transferred. Due to the extensive utilization and high turnaround cycle duties of these tanks, the tanks expand much faster and beyond the expected rate.

However, due to the extended procedure of API standards, tank calibrations do not happen very often. Consequently, the expansion in the tank's volume can go undetected causing the tank transferred quantities to be under-estimated. Overtime, the difference between the actual tank volume and calibrated volume as reported in the tank capacity table accumulates leading to financial losses.

Additionally, the aforementioned calibration techniques can require tank downtime (e.g., emptying of the tank or otherwise halting the tank operation temporarily), which accumulates additional costs to the losses incurred. Moreover, many of the foregoing testing techniques are invasive in that they require accessing the internal volume of the tank and also can be destructive.

The existing methods for tank calibration present significant drawbacks. For instance, using the current standards, it can take one to two days of work to perform the calibration. Some known optical techniques involve time-consuming placement and movement of laser devices as required to take all container measurements. Additionally, many known methods pose safety risks for the workers performing the calibration process. As a result, calibration of storage tanks is performed infrequently, thus leading to inaccurate measurements of the actual volume stored within the tank or transferred to and from the tank, which can be costly. For example, a traditional timeframe between calibrations can be between five and fifteen years. Moreover, while laser-based techniques can allow more frequent calibration, these techniques are susceptible to errors that are introduced by inaccurate positioning of laser devices.

What is needed are systems and methods for efficiently calibrating volumetric measurements of petroleum product tanks (such as custody or storage tanks) for various purposes such as inventory management, determining calibration frequency for custody tanks, verifying the validity of previous calibrations, coordinating tank calibration and evaluating the structural integrity of the tanks.

It is with respect to these and other considerations that the disclosure made herein is presented.

SUMMARY OF THE DISCLOSURE

According to an embodiment consistent with the present disclosure, a system for predictive volumetric estimation of storage tanks is provided. The system comprises a calibration device configured to measure calibration data relating to volumetric calibration of the tanks. The system further includes a computing device comprising a processor in operative communication with a communication interface, an input/output interface and a non-transitory computer readable storage medium having instructions stored therein that are executable by the processor.

In particular, the instructions configure the processor to, receive sets of historical data concerning respective tanks among the tanks. The historical data sets include historical calibration data previously measured using the calibration device. Additionally, the instructions configure the processor to generate a predictive machine learning (ML) model for estimating volumetric changes in a tank, wherein the predictive model is generated by applying ML algorithms to the historical data sets. The instructions further configure the processor to apply the predictive ML model to one or more historical data sets for a given tank among the tanks to estimate one or more current parameters for the given tank. Furthermore, the instructions configure the processor to generate, based on the estimated one or more current parameters for the given tank, an instruction to perform one or more operations for the given tank.

The system further comprises an implementation tool that is in operative communication with the processor and that is configured to perform the one or more operations as a function of the instruction from the computing device.

According to another embodiment consistent with the present disclosure, a method for predictive volumetric estimation of storage tanks is provided. The method includes: receiving, at a computing device comprising a processor in operative communication with a communication interface, an input/output interface and a non-transitory computer readable storage medium having instructions stored therein that are executable by the processor, sets of historical data concerning respective tanks among the tanks. The historical data sets include historical calibration data previously measured using a calibration device configured to measure calibration data relating to volumetric calibration of the tanks. The method further includes generating, with the processor of the computing device, a predictive machine learning (ML) model for estimating volumetric changes in a tank. In particular, the predictive model is generated by applying ML algorithms to the historical data sets.

Additionally, the method includes applying, with the processor of the computing device, the predictive ML model to one or more historical data sets for a given tank among the tanks to estimate one or more current parameters for the given tank. Furthermore, the method includes generating, with the processor, an instruction to perform one or more operations for the given tank as a function of the estimated one or more current parameters.

Any combinations of the various embodiments and implementations disclosed herein can be used in a further embodiment, consistent with the disclosure. These and other aspects and features can be appreciated from the following description of certain embodiments presented herein in accordance with the disclosure and the accompanying drawings and claims.

BRIEF DESCRIPTION OF THE DRAWINGS

FIG. 2 is a process flow diagram illustrating an exemplary method for predictive volumetric and structural evaluation of storage tanks, according an embodiment.

Figure 1:
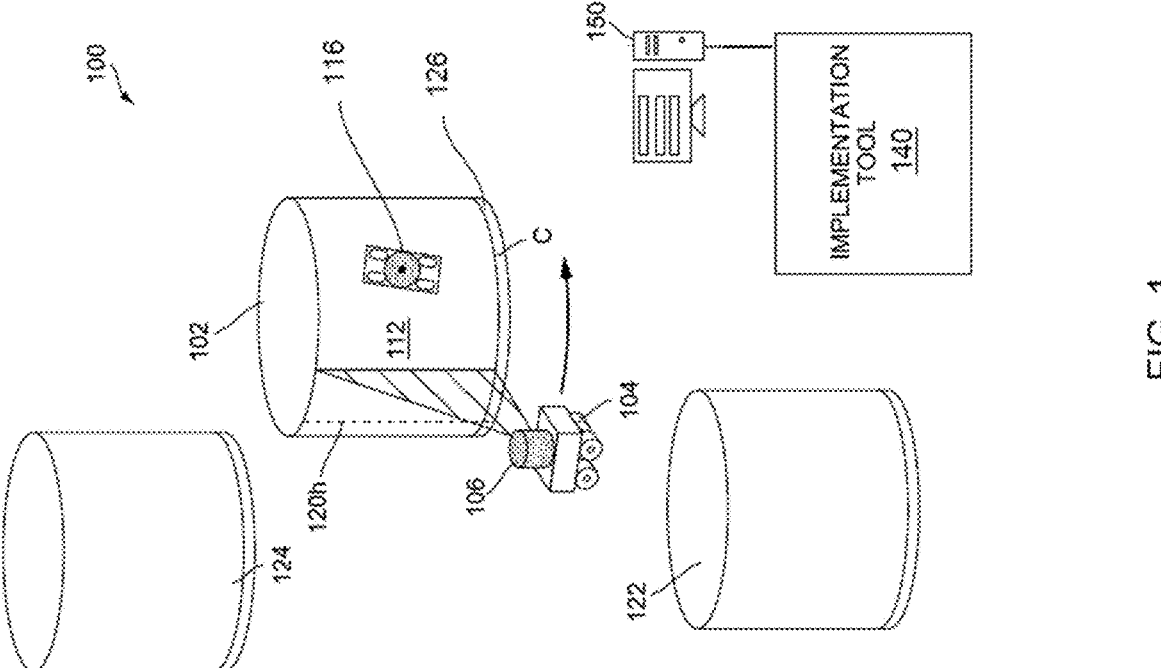
FIG. 1 is a conceptual perspective view representation of an exemplary system for predictive volumetric and structural evaluation of storage tanks, according an embodiment.

It is noted that the drawings are illustrative and are not necessarily to scale.

DETAILED DESCRIPTION OF CERTAIN EMBODIMENTS OF THE DISCLOSURE

By way of overview and introduction, systems and methods are disclosed for predictive volumetric and structural evaluation of petroleum product containers. Measuring and determining the volume of containers is referred to herein as "calibration." The container is, in various embodiments, a large petroleum product tanks such as custody and storage tanks (hereinafter tank or container for simplicity).

The system and methods for predictive volumetric and structural evaluation of tanks are configured to capture various measurements, build, and implement a predictive model for estimating volumetric measurements of tanks, among other physical parameters concerning the volume or structural integrity of tanks. The measurements are further used for performing further practical operations such as inventory management, determining calibration frequency for custody tanks, verifying the validity of previous calibrations, performing calibration and evaluating the structural integrity of the tanks.

Currently, to determine whether a custody tank should be calibrated, an operator typically performs a manual strapping of the bottom tank shell to measure the circumference. This measurement is then compared to the previous measurements taken and if it is not within the API/ISO tolerance, a calibration is performed. This process requires manual labor, is time consuming and provides only an indirect assessment of tank expansion.

In accordance with one or more embodiments, the system generates and utilizes a machine learning-based predictive model, which can be implemented in a computing system, that aids the current custody measurement units at terminals and other facilities that have storage tanks. The predictive models achieved using the disclosed systems and methods are trained utilizing various historical data and other relevant parameters for calibration and inspection activities and can efficiently provide a holistic representation for the health of tanks based on various combinations of current and historical data-points obtained for the tanks.

According to a salient aspect, by using a machine learning model trained on historical information obtained for a plurality of tanks, the disclosed systems and methods are configured to accurately estimate volumetric and related structural information for a tank without the need for taking measurements or otherwise reducing the amount and frequency of manual measurements.

The disclosed systems and methods are configured to utilize the latest innovations in machine learning by using historical data measured from various tanks along with current operating parameters to develop models for various different tank categories to generate predictive estimations of tank capacity tables, tank tilt, tank wall roundness or shape, among other structural parameters.

These estimated models implemented by the system serve to provide a tool for making more optimal decisions related to tank calibration activities such as, for inventory management, calibration frequency determination for custody tanks, validity of previous calibrations and the like. Additionally, the predictive models can be used to instruct maintenance and inspection activities as well. While described in the context of petroleum custody tanks, the systems and methods disclosed herein are also not limited to custody and royalty tanks but can be applied to any storage tank, including those used in other industries.

Further benefits provided by the system and method for predictive volumetric and structural evaluation of storage tanks include: avoiding unnecessary manual measurement and simplifying or more-efficiently performing manual calibration processes in view of estimations from the trained ML model; providing a dynamic inventory management system that adapts without the need for physical calibrations on storage tanks; providing a tool capable of verifying the accuracy of actual physical tank calibrations; and providing a more holistic and efficient way to estimate the health of the tanks in the facility.

FIG. 1 is a conceptual perspective view of an exemplary system 100 for predictive volumetric and structural evaluation of storage tanks, such as a tank 102, according to various embodiments. As shown, the system 100 includes a computing system 150. The system can further include one or more tank data collection devices in operative communication with the computing system 150. The data collection devices are various devices suitable for collecting measurements relating to the volume of the cylindrical storage tank 102, the volume of its contents, its structural integrity and other such tank parameters, and providing those data points to the computing system 150.

The computing device 150 can be configured to determine when and/or how often a tank requires calibration and optimize the determination based on a number of factors. The computing device 150 is configured by executing instructions in the form of a software program that generates and uses a machine learning (ML) derived predictive model to estimate volumetric changes in a tank based on multiple inputs. The computing device 150 is further configured to utilize that estimate to determine the priority/timing of when the tank 102 (or tanks) should be calibrated, The determination can be made in view of additional inputs, for instance, in order to optimize profitability, reliability, minimizing impact on operations or some other prescribed objective. By way of further example, inputs pertinent to determining profitability can include the type of product in a tank, the amount of product moving through the tank, contractual or standard obligations for calibration frequency and the like. Measurements and other such inputs to the computing system 150 that inform the generation or application of the predictive model are generally referred to as tank parameters, which are further described below.

The computing device 150 can be in communication with or configured to receive calibration data from one or more tank data collection devices. As shown in FIG. 1, tank data collection devices can include, for example and without limitation, tank calibration devices such as a 3D laser range finder ("LIDAR device") 106 mounted to a robotic vehicle 104 for measuring measure the outward/inward deviations of a wall 112 of the tank 102 (e.g., along its height 120h). Also shown in FIG. 1, for example and without limitation, is a robot-mounted sensor device 116 provided on the exterior wall 112 of the tank 102 configured to acoustically measure container dimensions and/or liquid volume. Also shown, for example and without limitation, is a tank strapping device 126 for manually measuring the tank circumference C (e.g., in accordance with standard API MPMS 2.2A). While not shown, computing device 150 can be operatively connected to other data collection devices such as computers used by human operators performing manual calibration (e.g., using strapping device 126) or other tank inspection activities to record tank parameters.

Exemplary systems and methods for LIDAR-based container volume calibration are shown and described in co-pending and commonly assigned U.S. patent application Ser. No. 16/716,381, to Trigui et al, titled "SYSTEM AND METHOD FOR ALIGNING A LASER SCANNING DEVICE FOR MEASUREMENT OF A VOLUME OF A CONTAINER," filed Dec. 16, 2019, the disclosure of which is hereby incorporated by reference in its entirety herein. Exemplary systems and methods for acoustic container volume calibration are shown and described in co-pending and commonly assigned U.S. Pat. No. 10,458,831, to Cunningham et al, titled "SYSTEM AND METHOD FOR ACOUSTIC CONTAINER VOLUME CALIBRATION," issued Oct. 29, 2019, the disclosure of which is hereby incorporated by reference in its entirety herein.

The LIDAR, acoustic, and manual strapping calibration devices are non-limiting examples. It should be understood that more or fewer devices can be used to obtain the tank parameters that are input to the computing device 150 and inform the predictive volumetric and structural evaluation methods disclosed herein. Additionally, other types of tank calibration and inspection systems can be used to measure one or more of the tank parameters.

The system 100 can further include an implementation tool 140 that is operatively connected to the computing device 150. The implementation tool 140 can include, for example, a calibration device, an inventory management system, a maintenance management system, an autonomous device (e.g., robot) for performing maintenance operations. The implementation tool can also include control systems for controlling operation of a network of tanks and fluid transfer systems interconnecting the tanks. The implementation tool 140 can be fully automated to operate according to instructions received from the computing device 150. The implementation tool can also operate in whole or in part under human control.

Although system 100 is shown in FIG. 1 as being implemented on one storage tank 102, the system can similarly be implemented for a plurality of storage tanks, such as tanks 122 and 124 and for various types/categories of tanks. Accordingly, it should be understood that the computing device 150 is preferably configured to receive respective sets of historical and/or current tank data for each of a plurality of tanks. It should be further understood that the volumetric estimation and related operations performed for tank 102 using the system 100 can similarly be performed for any number of tanks.

FIG. 2 is a process flow diagram illustrating an exemplary method 200 for predictive volumetric and structural evaluation of storage tanks, according to an embodiment. The method 200 and other methods disclosed herein can be implemented using components and techniques illustrated in and described with reference to the embodiments shown in FIG. 1. The method 200 generally includes steps directed to generating one or more predictive models by applying machine learning techniques to historical data measured from multiple tanks over time, applying the predictive ML model(s) to estimate volumetric and structural parameters of one or more tanks, evaluating the performance of the ML model(s) and refining them based on subsequent calibrations of the one or more tanks.

Portions of this and other methods disclosed herein are described as being performed using computing device 150. It should be understood that portions of this and other methods disclosed herein can be performed on or using a custom or preprogrammed logic device, circuit, or processor, such as a programmable logic circuit (PLC), computer, software, or other circuit (e.g., ASIC, FPGA) configured by code or logic to carry out their assigned task. The device, circuit, or processor can be, for example, a dedicated or shared hardware device (such as a laptop, a single board computer (SBC), a workstation, a tablet, a smartphone, part of a server, or a dedicated hardware circuit, as in an FPGA or ASIC, or the like), or computer server, or a portion of a server or computer system. The device, circuit, or processor can include a non-transitory computer readable medium (CRM, such as read-only memory (ROM), flash drive, or disk drive) storing instructions that, when executed on one or more processors, cause portions of the method 200 (or other disclosed methods) to be carried out.

In the example method 200, building a predictive ML model begins with the step of categorizing 210 tanks into respective categories. For example, tank categories can include, Vertical Tanks, Horizontal tanks, Fixed roof tanks, Floating roof tanks, Spherical Tanks, Underground Tanks, and Other tanks. Tank 102 shown in FIG. 1, for example, is a vertical tank having a cylindrical shape.

The method 200 includes, for each tank category, collecting 220 historical data. Historical data is preferably collected for a plurality of tanks using the data collection devices (e.g., calibration devices 116, 106 and 126) and provided to the computing device 150 via a communication connection or input interface. In an exemplary embodiment, historical data values for the following tank parameters that can correlate to changes in tank volume are recorded for each tank:

Date of tank installation;

For each previous calibration: historical calibration data, including, measurements of various parameters taken using calibration device(s) for generating capacity tables (e.g. offset measurements, deadwood, circumference, etc.), the method used for calibration, and the Capacity Table generated as a result of the previous calibration;

Frequency of tank usage, including, for example, product transfer frequency;

Type of material used to construct the tank (e.g., metal, composite, etc.);

Operating conditions within the tank, including, for example, temperature, pressure, etc.;

Type of product in tank, including, for example, refined hydrocarbons, water, etc.;

Ambient conditions, including, for example, ambient temperature, humidity, etc.;

Tank geographic location;

Tank height;

Tank shell height;

Tank tilt;

Inspection data (such as thickness measurements, or other work orders related to the tank—e.g. cleaning, painting, etc. that correlate with changes);

Additional physical characteristics of the tank derived from the foregoing parameters; and Historical data from nearby tanks, including, for example, any of the foregoing parameters and parameters derived therefrom, including, for example, measured expansion rate, etc.

The method 200 additionally includes, for each tank category, training 230 a predictive ML model based on the historical data for a plurality of tanks. The training of the model can be performed using any of the standard ML algorithms. The algorithms used could be supervised, unsupervised, time series based, or an ensemble of algorithms. The supervised algorithms can be used to train the model based on historical data. Unsupervised algorithms can assist to visualize and cluster features to identify what feature sets (input variables) are dependent or independent, which can assist in reducing dimensionality of the data. A recurrent neural network, which is a type of network suited for time series data, can also be used and well suited to the application as historical data related to tank expansion is typically tracked with time.

The method 200 additionally includes applying 240 one or more of the trained predictive ML models to estimate current volumetric parameters of a given storage tank and related structural parameters. More specifically, given a current tank (e.g., tank 102), step 240 can involve first identifying the relevant trained ML model to use for the given tank. The relevant model can be selected based on tank category among other tank parameters suitable for classifying similar tanks. Step 240 can also include applying the relevant trained model to estimate one or more pertinent parameters relating to tank volume and condition. Estimated parameters can include: volumetric information (e.g., current estimated Capacity Tables), tank structure estimations (e.g., current estimated wall profile), tank tilt, expansion rate for each tank shell, and a time for next calibration. For example, to generate an estimated parameter such as capacity table, the model can be configured use some or all of the inputs described above as historical data to directly generate an estimated capacity table for a given tank, based on the predicted changes in the tank's structure. In the example of using a neural network that has been trained using historical data, the ML model is trained to generate an output based on the input provided, which could be a combination of historical data and current data, or only historical data.

The method 200 additionally includes validating 250 record data and predicted results including calculating an estimated error in the prediction of any parameters estimated at step 240. Validating record data can further assist the automated computing system as well as human operators in determining if calibration or maintenance actions are needed. For example, in some embodiments, after creating the predictive model using a training data set, the predictive model can be compared with a test data set to assess the model's accuracy. The model can also be validated against measurements taken in the field after an estimate is generated. Application of statistical analysis algorithms can further provide statistical information about the accuracy of the estimate, for example, the standard deviation in the output, the maximum observed deviation, and the like. Accuracy and error metrics could be in general for the model, or based on specific details, such as the age of last calibration or the quality/quantity of historical information available, especially in the time since the last calibration.

The method 200 also includes validating 260 the accuracy of the model during periodic calibration by comparing its predicted results with actual calibration measurements. More specifically, actual calibration measurements measured for a given tank can be received by the computing device 150 and compared to the corresponding parameter values estimated using the trained predictive ML model for the given tank.

The method 200 additionally can include retraining 270 the ML model if there is room for improvement based on the error of the predicted results relative to actual calibration measurements. In some embodiments, step 270 can also include algorithmically determining a relative importance of various sources of input data in generating accurate predictions from the model. In some embodiments, step 270 can also include assessing what input data can be available for a given tank, whether any salient input data can be collected easily and/or frequently to enhance the predicted volumes/ other aspects of the tanks in the model at least a prescribed amount. For example, at step 270, the computing device 150 can determine from analyzing historical data whether manual strapping provides significant data for improving the model's accuracy, or whether a few vertical profiles of a tank wall would provide more reliable data and insight. Accordingly, if an operator has limited resources to calibrate a given tank or tanks, the system can determine and recommend the most effective way for the operator to use the available resources to maximize the accuracy of the predicted volumes using the model, even suggesting details of the inspection process, such as which side of the tank to take a measurement on.

In some embodiments, the exemplary method 200 takes into account various parameters such as geometrical shape of the tank, operating conditions, etc. to provide an improved estimation of the remaining wall thickness based on machine learning models.

The method 200 additionally includes performing 280 one or more further operations based on the parameters estimated at step 240. Step 280 can also be performed based on the accuracy validation performed at step 250. Step 280 can be performed by the computing device 150, alone or in combination with one or more implementation tools 140 and can involve a variety of practical operations noted above and further described herein.

The system 100, particularly computing device 150, is in some embodiments, a tool that determines when and/or how frequently to calibrate one or more tanks. As noted, this determination can be optimized based on a number of additional input factors. For instance, the computing device 150 uses the ML-derived model to estimate volumetric changes in a tank based on multiple inputs. In some embodiments, the computing device 150 can be further configured to use that estimate, plus additional inputs relating to engineering or business requirements, to recommend the priority and/or timing of when one or more tanks should be calibrated in order to optimize profitability, reliability, or some other user-defined objective.

As noted, the exemplary computing device 150 can be in operative communication with one or more implementation tools 140, which are configured to perform further operations in response to parameters estimated according to the predictive ML models. In some embodiments, the implementation tool can include one or more of a calibration device, an inventory management computing system, a calibration management computing system, a maintenance management computing system, and an autonomous maintenance device. While shown as separate devices in FIG. 1, features and functionality of one or more of the exemplary implementation tools can be realized in whole or in part using the computing device 150. For instance, calibration management, inventory management and maintenance management systems can be integrated with the computing device 150.

Various additional determinations and operations can be made or implemented by the computing device 150, alone or in conjunction with an implementation tool 140, as a function of the output generated by the predictive ML model.

In some embodiments, the computing device 150 or implementation tool 140 can be configured to determine the estimated loss/day in a given tank as a function of the predicted tank parameters output by the predictive ML model. The computing device 150 can further be configured to compare the estimated loss/day with the estimated cost to calibrate a given tank to an allowable accuracy level so as to determine the target time to calibrate the tank as a function of cost considerations.

For example, instead of requiring a specific process (e.g., an API standard method of calibration) before a calibration table for a given tank can be corrected, the computing device 150 can enforce rules on requiring physical calibration of a tank or authorizing updating of a calibration table according to values predicted using the predictive ML model. The rules can, for example, require an estimated parameter error of no more than a threshold error, say, 0.01%, before calibration tables for a given tank can be updated according to parameter values estimated using the predictive ML model.

In some embodiments, the computing device 150 can be configured to calculate what the future losses might be for a given tank if left un-calibrated as a function of operational usage data (e.g., what product is stored there, how many times it is cycled, what the price of that product is and the like) as well as future operational data (e.g., plans for sales, distribution and the like).

In some embodiments, the computing system 150 can be configured to perform adaptive calibration management. In particular, the computing system can be configured to determine, based on training, evaluating and optionally re-training the predictive ML model pursuant to method 200, what physical inspection/calibration data and/or calibration methods would be usable to better estimate the volume of a tank (e.g. to within an error rate that is acceptable for updating the calibration tables).

Moreover, in some embodiments, the computing system 150 can be configured to automatically collect that data by sending control instructions to an appropriate implementation tool 140 (e.g., an autonomous calibration device 116 or 106). In addition or alternatively, the computing system 150 can generate electronic notifications to schedule services with a manual operations team, for instance, a calibration team that performs tank calibration using a manual strapping calibration device 126.

Furthermore, in some embodiments, the computing system 150 can automatically transmit instructions to a computer-controlled calibration device (e.g., the robot-based LIDAR calibration device 116) that optimize the calibration measurements to achieve a predictive model having a target degree of accuracy. For example, the computing system 150 can, based on the predictive ML model, determine how many vertical 'stations' would need to be measured for a given tank, which specific portions of the tank needed to be measured, and other such parameters necessary to predict the tank volume to a sufficient degree of accuracy.

Additionally, in some embodiments, the computing system 150 can be configured to receive a live input feed of information captured during inspections/calibrations and analyze the information in view of the predictive ML model. Accordingly, the computing system 150 can be configured to dynamically instruct the automated calibration systems or manual operators as to whether any additional measurements need to be taken. For instance, if after four measurements, there is significant deviation from what the predictive ML model expects, the computing device can be configured to request additional measurements.

Accordingly, the computing system 150 can be configured to dynamically control and modify calibration operations in near real time. It should be understood that dynamic, adaptive calibration control can similarly be performed in connection with other types of measurements beyond robotic-based calibration systems. For instance, in connection with collecting manual strapping data using strapping system 126, instead of simply using a predefined table based on tank size and allowable change, the computing system can determine the necessary measurements as a function of live measurements, among other tank parameters, to determine whether additional calibration measurements are needed.

The computing device 150, in conjunction with implementation tool 140, can further be configured to perform various operations in order to improve calibration. For instance, computing device 150 can instruct the implementation tool 140, which controls one or more fluid pumps, to pump fluid from one tank to another, routing the fluid through a specific flow meter or set of flow meters in data communication with the computing device 150 thereby reporting the fluid flow data from which the volume of the tank and/or the fluid contained therein can be determined.

In some embodiments, the implementation tool 140 can comprise an inventory management system configured to use the tank volume estimates generated by the computing device 150 for charging customers for transfers from that tank (preferably subject to a suitable level of accuracy).

Whereas the volume of a container is typically a parameter that changes incrementally and relatively slowly over time, the computing device 150 and the predictive ML models can similarly be trained to estimate more dynamically varying parameters such as the changing liquid volume in a given tank over a relatively small period of time. In some embodiments, the computing device 150 implementing the predictive ML model can be configured to estimate parameters such as volume of liquid in a tank, after filling without letting the product fully settle and equalize temperature, as a function of variables including, for example, where the product came from, environmental data, tank calibration data, product type, and the like. As a result, the system can be configured to provide a faster measurement of the quantity of product within a tank despite the product being non-homogeneous in terms of temperature and being unsettled. By comparison, settling and obtaining uniform temperature is normally required in order to calculate adjusted volumes for products at various temperatures, which restricts the rate at which a custody transfer tank can be used to accurately transfer product.

As noted, in some embodiments, additional inputs beyond those data points captured for a given tank can be provided to the predictive ML model during training and application to more accurately estimate the one or more parameters using the predictive ML model. For instance, in some embodiments, the computing device 150 can be configured to receive and utilize volume measurements, flow times, or flow meter measurements captured from other tanks and pipes/conduits as product moves across multiple facilities or through a variety of pipe networks to improve the volume estimates of one or more of the tanks the product are being moved between.

In addition to custody tank capacity tables, meters are also used for tracking volume transferred and the associated sales. However, flow meters usually require "proving" as a part of their maintenance activity so that they are functioning with the desired accuracy. This activity needs to be done frequently and with proper planning as well as by following standards as it is not straightforward. Accordingly, in some embodiments, the computing device 150 can be further configured to utilize the estimated tank calibration parameters to prove the operational status and accuracy of flow meters and vice versa. More specifically, in this embodiment, the computing device 150 can be connected to the flow meter supervisory system. Based on the ML Models, the computing device 150 can be configured to determine if there are discrepancies between the volume of the tank as predicted by the model and as reported by the meters. Additionally, based on the determinations, the computing device can be configured to notify operators for the need to prove meters or calibrate a tank or trigger other maintenance activities/calibrations (e.g. other monitoring sensors.) Moreover, in some embodiments, the computing device 150 implementing the predictive ML models can perform integration of sensor readings from all meters across the entire network to look for sensors/calibrations that are not measuring accurately. This capability can help with a problem of lost product across long networks, where small fractions of materials can sometime seem to disappear only to show up somewhere else. A fully optimized predictive ML model of the network can learn from these occurrences over time to identify the source of the error. In such embodiments, the Predictive ML model can be used to identify leaks as well, as 'lost volume' would actually mean that the product got lost due to accurately calibrated systems.

It should be appreciated that the system 100 is integratable within a greater network of tanks, pipes and related monitoring systems/devices to provide an enhanced inventory management tool. Empowered by accurate calibrations using the ML models, the computing device 150 integrated with other sensors is capable of providing highly accurate measurement and tracking of inventory.

In some embodiments, the computing device 150 can further be configured to utilize external imaging of the tanks as an input into the predictive ML model for training and estimation. Such imagery, as processed using the ML algorithm, can enable the predictive ML model to identify rust spots, reflections, subtle changes in coloring or lighting at various times of day and further inform the estimation of volumetric and structural parameters for the tank. In some embodiments, during training and/or estimation, the computing device 150 can be configured to use LIDAR or 3D point clouds of the tanks received, for example, from LIDAR calibration device 106, as an input to the predictive ML model for improved estimation of the tank's parameters.

As noted, estimates concerning parameters relating to the volume of a tank can similarly be used to determine structural parameters for a tank. Accordingly, in some embodiments, estimated parameters of tanks that are indicative of structural issues that need to be rectified or managed can be provided to an implementation tool configured to coordinate operation of maintenance and other inspection activities. For instance, the computing device 150 is configured to take into account various parameters such as geometrical shape of the tank structure, operating conditions and the like to generate an estimation of the remaining wall thickness based on the predictive ML models that can further inform structural testing and maintenance of the tank using a suitable implementation tool.

Additionally, in some embodiments, implementation tool 140 can comprise a maintenance management system configured to coordinate manual and/or automated maintenance activities. For example, in some embodiments, implementation tool 140 can comprise an autonomous non-destructive testing device configured to physically measure the structural parameters of a tank as a function of the estimated tank parameters (e.g., remaining wall thickness). By way of further example, in some embodiments, the implementation tool 140 can comprise an autonomous maintenance robot for repairing structural problems revealed by the estimated tank parameters.

The methods described herein may be performed in part or in full by software or firmware in machine readable form on a tangible (e.g., non-transitory) storage medium. For example, the software or firmware may be in the form of a computer program including computer program code adapted to perform some or all of the steps of any of the methods described herein when the program is run on a computer or suitable hardware device (e.g., FPGA), and where the computer program may be embodied on a computer readable medium.

Figure 3:
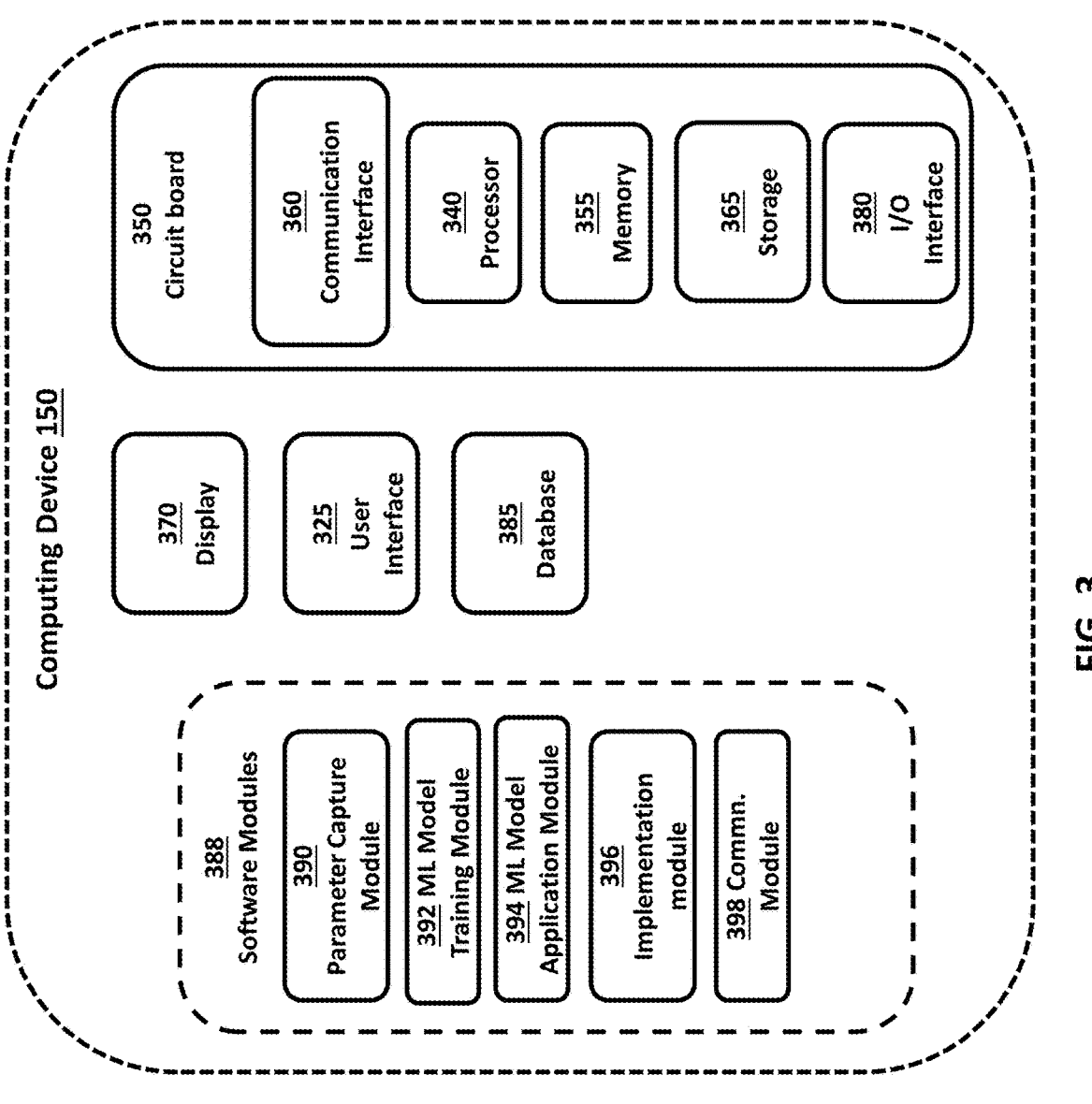
FIG. 3 is a block diagram illustrating an exemplary configuration of hardware and software components of an exemplary computing device, according to an embodiment.

FIG. 3 is a block diagram illustrating an exemplary configuration of hardware and software components of one or more of the computing devices, for instance computing device 150, described in the present disclosure as performing the various operations relating to predictive volumetric and structural evaluation of storage tanks.

Components of the computing device include a processor 340 that is shown in FIG. 3 as being disposed on a circuit board 350. The circuit board can include a memory 355, a communication interface 360 and a computer readable storage medium 365 that are accessible by the processor 340. The circuit board 350 can also include or be coupled to a power source (not shown) source for powering the computing device.

The processor 340 and/or the circuit board 350 can also be coupled to a display 370, for visually outputting information to an operator (user), a user interface 325 for receiving operator inputs. The processor 340 can also be operatively connected to an input/output interface 380 for receiving and outputting electronic signals to one or more connected devices as would be understood by those in the art. As an example, the processor 340 could emit a visual signal from the display 370, for instance, a computer model depicting the dimensions of a tank and related volumetric parameters. Although the various components are depicted either independent from, or part of the circuit board 350, it can be appreciated that the components can be arranged in various configurations.

The processor 340 serves to execute software instructions that can be loaded into the memory 355. The processor 340 can be implemented using multiple processors, a multiprocessor core, or some other type of processor. The memory 355 is accessible by the processor 340, thereby enabling the processor 340 to receive and execute instructions stored on the memory 355 and/or on the computer readable storage medium 365. Memory 355 can be implemented using, for example, a random-access memory (RAM) or any other suitable volatile or non-volatile computer readable storage medium. In addition, memory 355 can be fixed or removable.

The computer readable storage medium 365 can also take various forms, depending on the particular implementation. For example, the computer readable storage medium 365 can contain one or more components or devices such as a hard drive, a flash memory, a rewritable optical disk, a rewritable magnetic tape, or some combination of the above. The computer readable storage medium 365 also can be fixed or removable or remote such as cloud-based data storage systems (remote memory or storage configuration not shown). The computer readable storage medium 365, for example, can be used to maintain a database 385, which stores information relating to the capture of measurement data, the dimensional calibration of respective structures and/or data used or generated while carrying out operations and implementing aspects of the systems and methods disclosed herein.

One or more software modules 388 are encoded in the memory 355 and/or the computer readable storage medium 365. The software modules 388 can comprise one or more software programs or applications having computer program code or a set of instructions executed by the processor 340. Such computer program code or instructions for carrying out operations and implementing aspects of the systems and methods disclosed herein can be written in any combination of one or more programming languages. While the software modules 388 are stored locally in computer readable storage medium 365 or memory 355 and execute locally in the processor 340, the processor 340 can interact with a remotely-based computing platform via communication interface 360, and via a local or wide area network to perform calculations, analysis, control, and/or any other operations described herein.

During execution of the software modules 388, the processor 340 is configured to perform the various operations described herein, including without limitation, the previously described steps for predictive volumetric estimation of storage tanks. The software modules 388 can include code for implementing the aforementioned steps and other steps and actions described herein, for example and without limitation: a data capture module 390, which configures the processor to perform the various operations relating to receiving measured tank parameters and other inputs used to perform ML model training, applying the ML model application and further operations; a ML model training module 392, which configures the processor to perform the various operations relating to training, evaluating performance and re-training the predictive ML models; a predictive ML model application module 394, which configures the processor to perform the various operations relating to using the predictive ML models to perform volumetric and structural evaluation of storage tanks and related operations; an implementation module 396, which configures the processor to perform the various additional determinations and operations, alone or in conjunction with an implementation tool 140, as a function of the output generated by the predictive ML model; and a communication module 398, which configures the processor 340 to communicate with remote devices over a communication connection such as a communication network or any wired or wireless electronic communication or input/output interface.

The program code of the software modules 388 and one or more of the non-transitory computer readable storage devices (such as the memory 355 and/or the computer readable storage medium 365) can form a computer program product that can be manufactured and/or distributed in accordance with the present disclosure.

At this juncture, it should be noted that although much of the foregoing description has been directed to systems and methods for predictive volumetric and structural evaluation of storage tanks, the systems and methods disclosed herein can be similarly deployed and/or implemented in scenarios, situations, and settings far beyond the referenced scenarios.

It should be appreciated that more or fewer operations can be performed than shown in the figures and described. These operations can also be performed in a different order than those described. It is to be understood that like numerals in the drawings represent like elements through the several figures, and that not all components and/or steps described and illustrated with reference to the figures are required for all embodiments or arrangements.

Thus, illustrative embodiments and arrangements of the present systems and methods provide a system and a method (which in various embodiments is at least partially computer-implemented), computer system, and computer program product for predictive volumetric and structural evaluation of storage tanks. The flowchart and diagrams in the figures illustrate the architecture, functionality, and operation of possible implementations of systems, methods and computer program products according to various embodiments and arrangements. In this regard, each block in the flowchart or other diagrams can represent a module, segment, or portion of code, which comprises one or more executable instructions for implementing the specified logical function(s). It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the diagrams and/or flowchart illustration, and combinations of blocks in the diagrams and/or flowchart illustration, can be implemented by and/or using special purpose hardware-based systems that perform the specified functions or acts, or combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

The subject matter described above is provided by way of illustration only and should not be construed as limiting. Various modifications and changes can be made to the subject matter described herein without following the example embodiments and applications illustrated and described, and without departing from the true spirit and scope of the invention encompassed by the present disclosure, which is defined by the set of recitations in the following claims and by structures and functions or steps which are equivalent to these recitations.

What is claimed is:

1. A system for predictive volumetric estimation of storage tanks, the system comprising:

a calibration device configured to measure calibration data relating to volumetric calibration of each tank, wherein the calibration data includes a dimension of the tank walls and wherein the calibration device is selected from the group consisting of:

a 3D laser range finder mounted to a robotic vehicle and configured to measure the dimension of the tank walls by measuring deviations of the tank walls in an inward or outward direction relative to an interior of the tank, and an acoustic sensor configured to acoustically measure the dimension of the tank walls; and a computing device comprising a processor in operative communication with a communication interface, an input/output interface and a non-transitory computer readable storage medium having instructions stored therein that that are executable by the processor, wherein the instructions configure the processor to:

receive sets of historical data concerning respective tanks among the tanks, wherein the historical data sets include multiple sets of calibration data previously measured using the calibration device for each of the respective tanks and further include values for a plurality of parameters for each of the respective tanks, generate a predictive machine learning (ML) model for estimating volumetric changes in a tank, wherein the volumetric changes in the tank represent a change in the volume of the tank, and wherein the predictive ML model is generated by the processor training a recurrent neural network algorithm on the historical data sets to correlate data points in the historical data sets with parameters representing a change in volume of the tank including one or more of, tank volume, tank structure, tank roundness, tank tilt, and expansion rate, receive and store, by the processor, current operational data concerning a given tank among the tanks, apply, by the processor, the predictive ML model to one or more historical data sets for the given tank among the tanks to estimate one or more current parameters for the given tank relating to a volumetric change in the tank, wherein the processor is further configured to estimate the one or more current parameters for the given tank by applying the predictive ML model to the current operational data along with relevant historical data from among the sets of historical data, wherein the one or more current parameters are selected from the group of parameters including, tank volume, tank structure, tank roundness, tank tilt, and expansion rate, and wherein prior to applying the predictive ML model, the processor is configured to select the predictive ML model among a plurality of trained predictive ML models based on a type of the given tank, and generate, based on the estimated one or more current parameters for the given tank, an output representing the estimated one or more current parameters for the given tank, an implementation tool, wherein the implementation tool is in operative communication with the processor and configured to perform one or more operations as a function of an instruction received from the processor, and wherein the processor is configured to generate, based on the estimated one or more current parameters for the given tank, the instruction to perform the one or more operations for the given tank for output to the implementation tool, wherein the implementation tool includes the calibration device, and wherein the instruction causes the calibration device to capture current calibration data in the form of one or more volume measurements for the given tank, wherein the processor is configured to receive the current calibration data from the calibration device and, based on the current calibration data and the predictive ML model, determine an updated estimate for the one or more current parameters and generate a revised instruction for the calibration device.

2. The system of claim 1, wherein the historical data sets for each the respective tanks further includes values for a plurality of parameters selected from the group consisting of:

an installation date for the respective tank, a capacity table for the respective tank generated from historical calibration data, a frequency of product transfer from the respective tank, a type of material that the respective tank is constructed from, a measured operating condition within the respective tank, a type of product contained in the respective tank, a measured ambient condition at the respective tank, a geographic location of the respective tank, a measured height of the respective tank, a measured tilt of the respective tank, and inspection data from a physical inspection of the respective tank.

3. The system of claim 1, wherein the computing device further comprises a display in operative communication with the processor, and wherein the processor is configured to output the estimated one or more parameters via the communication interface or the display.

4. The system of claim 1, wherein the estimated one or more current parameters includes the tank volume parameter and, wherein the processor is configured to generate an estimated current tank capacity table.

5. The system of claim 1, wherein the processor is in data communication with the calibration device via the communication interface.

6. The system of claim 2, wherein the implementation tool is one or more of: an inventory management computing system, a calibration management computing system, a maintenance management computing system, an autonomous maintenance device and a tank system controller.

7. A method for predictive volumetric estimation of storage tanks, the method comprising:

measuring, with a calibration device, calibration data relating to volumetric calibration of a plurality of storage tanks, wherein the calibration data includes the dimension of the tank walls and wherein the calibration device is selected from the group consisting of: a 3D laser range finder mounted to a robotic vehicle and configured to measure the dimension of the tank walls by measuring deviations of the tank walls in an inward or outward direction relative to an interior of the tank, and an acoustic sensor configured to acoustically measure the dimension of the tank's walls; and receiving, at a computing device comprising a processor in operative communication with a communication interface, an input/output interface and a non-transitory computer readable storage medium having instructions stored therein that that are executable by the processor, sets of historical data concerning respective tanks among the tanks, wherein the historical data sets include, for each of the respective tanks, multiple sets of calibration data previously measured using the calibration device;

generating, by the processor of the computing device, a predictive machine learning (ML) model for estimating volumetric changes in a tank, wherein the volumetric changes in the tank represent a change in the volume of the tank, and wherein the predictive ML model is generated by training a recurrent neural network algorithm on the historical data sets to correlate data points in the historical data sets with parameters representing a change in volume of the tank including one or more of, tank volume, tank structure, tank roundness, tank tilt, and expansion rate;

selecting, by the processor of the computing device, the predictive ML model among a plurality of trained predictive ML models based on a type of a given tank among the tanks;

applying, by the processor of the computing device, the predictive ML model to one or more historical data sets for the given tank to estimate one or more current parameters for the given tank relating to a volumetric change in the given tank; and outputting, by the processor of the computing device, an instruction including information representing the estimated one or more current parameters to an implementation tool, wherein the implementation tool is in operative communication with the processor and configured to perform one or more operations as a function of the instruction received from the processor, wherein the implementation tool includes the calibration device;

capturing, by the calibration device in response to the instruction, current calibration data in the form of one or more volume measurements for the given tank;

receiving, by the processor of the computing device, the current calibration data from the calibration device;

determining, by the processor of the computing device, based on the current calibration data and the predictive ML model, an updated estimate for the one or more current parameters;

generating, by the processor of the computing device, a revised instruction for the calibration device.

8. The method of claim 7, further comprising:

generating, with the processor, an instruction to perform one or more operations for the given tank as a function of the estimated one or more current parameters; and transmitting, by the processor, the instruction to an implementation tool in operative communication with the processor, wherein the instruction causes the implementation tool to perform the one or more operations.

9. The method of claim 7, further comprising: receiving, by the processor, current operational data concerning the given tank and wherein estimating the one or more current parameters for the given tank includes applying the predictive ML model to the current operational data.

10. The method of claim 7, wherein the one or more current parameters are selected from the group of parameters including, tank volume, tank structure, tank roundness, tank tilt, expansion rate, and a target time for next calibration.

11. The method of claim 7, wherein the step of outputting comprises: transmitting the estimated one or more parameters via the communication interface, or displaying the estimated one or more parameters via a display.

12. The method of claim 7, wherein the estimated one or more current parameters includes the tank volume parameter and, further comprising: generating, by the processor based on the estimated tank volume parameter, an estimated current tank capacity table, and causing a capacity table for the tank to be updated based on the estimated current tank capacity table.

13. The method of claim 8, wherein the implementation tool is one or more of: an inventory management computing system, a calibration management computing system, a maintenance management computing system, an autonomous maintenance device and a tank system controller.

14. The method of claim 7, wherein the historical data sets for each the respective tanks further includes values for a plurality of parameters selected from the group consisting of:

an installation date for the respective tank, a capacity table for the respective tank generated from historical calibration data, a frequency of product transfer from the respective tank, a type of material that the respective tank is constructed from, a measured operating condition within the respective tank, a type of product contained in the respective tank, a measured ambient condition at the respective tank, a geographic location of the respective tank, a measured height of the respective tank, a measured tilt of the respective tank, and inspection data from a physical inspection of the respective tank.

* * * * *